(12) United States Patent
Miyazaki et al.

(10) Patent No.: US 6,320,799 B1
(45) Date of Patent: *Nov. 20, 2001

(54) SEMICONDUCTOR MEMORY WITH A DECODER CIRCUIT HAVING A REDUNDANCY RELIEF FUNCTION

(75) Inventors: Hirokazu Miyazaki; Katsuaki Matsui, both of Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/576,996

(22) Filed: May 24, 2000

(30) Foreign Application Priority Data

Jul. 26, 1999 (JP) .................................. 11-211335

(51) Int. Cl.$^7$ ........................................ G11C 7/00
(52) U.S. Cl. ................. 365/200; 365/185.2; 365/189.09; 365/201; 365/210
(58) Field of Search ............................... 365/200, 185.2, 365/189.09, 201, 210

(56) References Cited

U.S. PATENT DOCUMENTS

| | | | |
|---|---|---|---|
| 5,812,466 | * 9/2000 | Lee et al. | 365/200 |
| 6,084,815 | 7/2000 | Matsushita et al. | 365/225.7 |
| 6,094,381 | * 7/2000 | Isa | 365/200 |
| 6,115,301 | * 9/2000 | Namekawa | 365/200 |

* cited by examiner

Primary Examiner—David Nelms
Assistant Examiner—Connie C. Yoha
(74) Attorney, Agent, or Firm—Jones Volentine, PLLC (57) ABSTRACT

The present invention provides a semiconductor memory capable of achieving redundancy relief for column line failure in a stable manner while realizing greater capacity and higher integration. A column decoder circuit CD11 provided in the semiconductor memory is provided with fuse blocks FB(0)~FB(127), first decoders DA(0)~DA(127), redundancy control circuits RL(0)~RL(127) and RLr, second decoders DB(0)~DB(255), DBr(0) and DBr(1) and column line drivers DV11(0)~DV11(255), DV11r(0) and DV11r(1). A redundancy control circuit RL(k) is connected with a column line driver DV11(2k) that drives a column line CL(2k) and a column line driver DV11(2k+1) that drives a column line CL(2k+1) via second decoders DB(2k) and DB2(2k+1) respectively.

16 Claims, 8 Drawing Sheets

SEMICONDUCTOR MEMORY WITH A DECODER CIRCUIT HAVING A REDUNDANCY RELIEF FUNCTION

BACKGROUND OF THE INVENTION

1. Field of the Invention

The present invention relates to a semiconductor memory and in more specific terms, it relates to a semiconductor memory provided with a decoder circuit having a redundancy relief function.

2. Description of the Related Art

A semiconductor memory such as a DRAM is normally provided with a column redundancy circuit that employs an ATD (address transition detector) or a shift-type redundancy circuit, to achieve an improvement in the yield. Of the two types of redundancy circuits, the shift-type redundancy circuit can be achieved through a simpler circuit structure compared to a column redundancy circuit employing an ATD and does not require as much time for the column line to enter an active state.

A semiconductor memory provided with a shift-type redundancy circuit is explained below in reference to FIG. 6. The semiconductor memory in the prior art, which constitutes a DRAM, includes a column decoder circuit CD1, a memory cell sub-array MCA and a sense amplifier sub-array SAA. The shift-type redundancy circuit constitutes part of the column decoder circuit CD1.

The memory cell sub-array MCA is provided with a plurality of memory cells MCij (i=0, 1, ..., j=0, 1, ..., 255). The individual memory cells MCij are connected to a plurality of word lines WL(0), WL(1), ..., WL(i), ..., and the plurality of complementary bit line pairs BL(0)/BLb(0), BL(1)/BLb(1), ..., BL(j)/BLb(j), ..., BL(255)/BLb(255), and are arranged at individual points of intersection in a matrix.

Each memory cell MCij constitutes a so-called 1-transistor memory cell comprising an N-type transistor (not shown) and a capacitor (not shown) with the gate, the drain and the source of the N-type transistor respectively connected with the word line WL(i), the bit line BL(j) and one end of the capacitor. At the other end of the capacitor constituting each memory cell MCij, a voltage at a level that is halfway between the source voltage Vcc of the DRAM and the substrate voltage Vss is applied.

The sense amplifier sub-array SAA located adjacent to the memory cell sub-array MCA is provided with a plurality of sense amplifiers SA(0), SA(1), ..., SA(255) and a plurality of data transfer circuits DT(0), DT(1), ..., DT(255). The bitline pair BL(j)/BLb(j) is connected to a data transfer circuit DT(k) via a sense amplifier SA(k) (k=0, 1, ..., 255), and the data transfer circuit DT(k) is further connected with a data bus pair LDB/LDBb and a column line CL(k).

Figure 6:
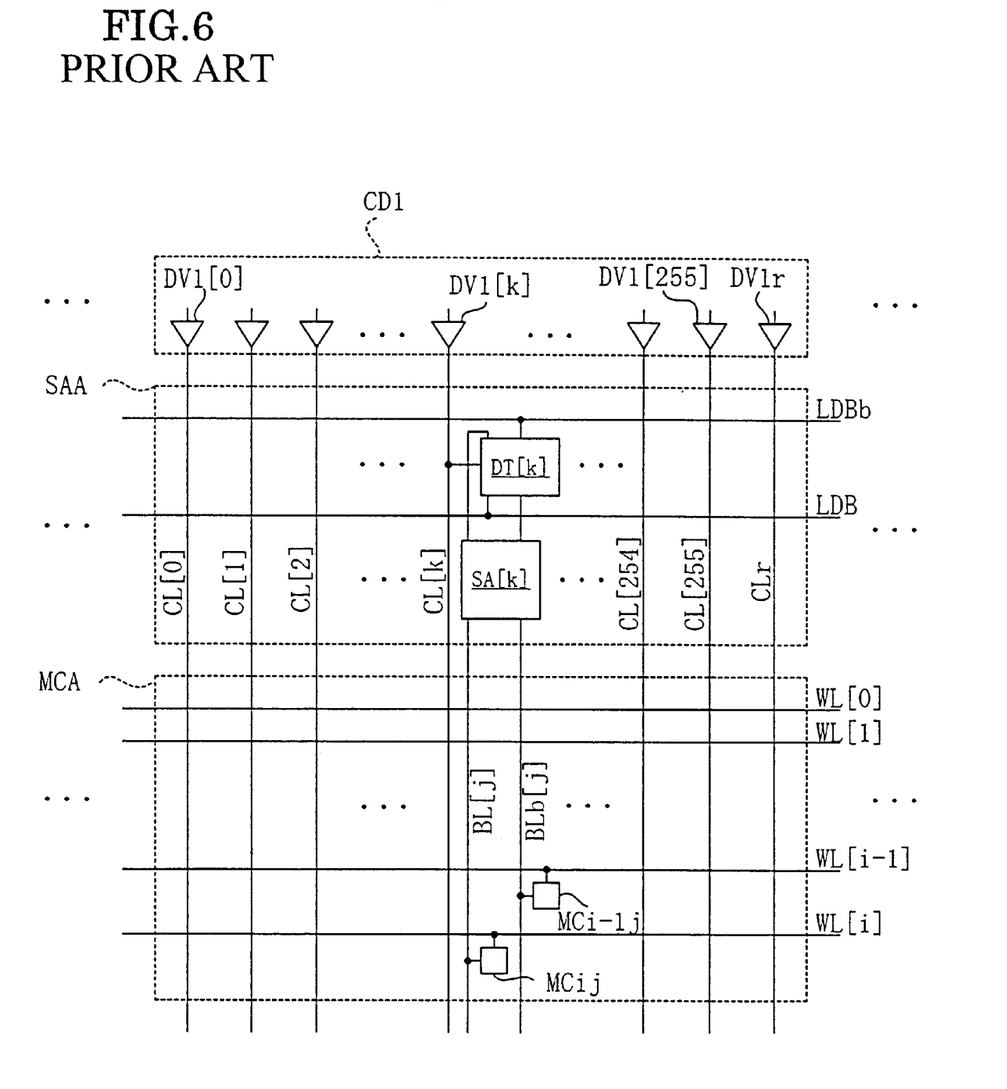
FIG. 6 is a circuit diagram illustrating the structure of a semiconductor memory in the prior art.

The operation achieved in the DRAM constituting the semiconductor memory in the prior art illustrated in FIG. 6 is now explained. When the word line WL(i) is selected, data that are stored as an electrical charge at the memory cell MCij connected to the word line WL(i) are output to the bit line BL(j), thereby generating a potential difference at the bit line pair BL(j)/BLb(j). The sense amplifier SA(k) detects the potential difference at the bit line pair BL(j)/BLb(j) and amplifies the potential difference.

If the column line CL(k) is selected by the column decoder circuit CD1 and is set to the source voltage Vcc, the data transfer circuit DT(k) connected with the column line CL(k) enters an ON state, and the bit line pair BL(j)/BLb(j) and the data bus pair LDB/LDBb become electrically continuous. As a result, the data amplified by the sense amplifier SA(k) are transferred to the data bus pair LDB/LDBb. Thus, a data read operation from the MCij is achieved. It is to be noted that the DRAM in the prior art illustrated in FIG. 6 is provided with an auxiliary column line CLr.

Figure 7:
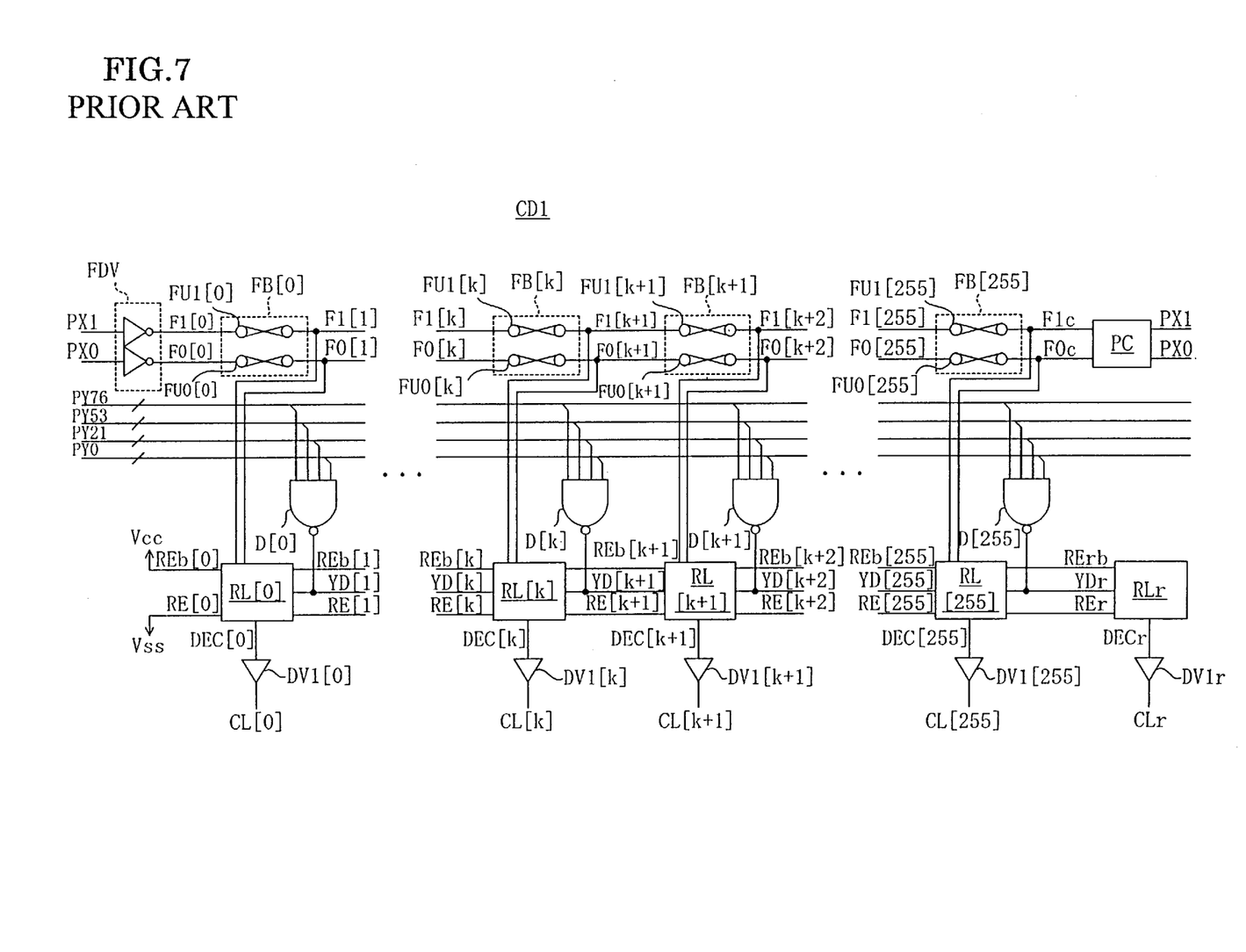
FIG. 7 is a circuit diagram illustrating the structure of the column line decoder circuit provided in the semiconductor memory in FIG. 6.

Next, the structure of the column decoder circuit CD1 is explained in reference to FIG. 7. The column decoder circuit CD1 is provided with fuse blocks FB(0), ..., FB(k), FB(k+1), ..., FB(255), decoders D(0), ..., D(k), D(k+1), ..., D(255), redundancy control circuits RL(0), ..., RL(k), RL(k+1), ..., RL(255) and RLr, column line drivers DV1(0), ..., DV1(k), DV1(k+1), ..., DV1(255) and DV1r, a fuse driver FDV and a pre-charge circuit PC.

The fuse block FB(k) is provided with two fuses FU0(k) and FU1(k) that are independent of each other. The fuse FU0(k) and the fuse FU1(k) are connected to the redundancy control circuit RL(k) via a fuse node F0(k+1) and a fuse node F1(k+1) respectively. In addition, the fuse FU0(k) and the fuse FU1(k) are respectively connected to a fuse FU0(k+1) and a fuse FU1(k+1) in the adjacent fuse block FB(k+1) via the fuse node F0(k+1) and the fuse node F1(k+1). As a result, the fuses FU0(0)~FU0(255) and FU1(0)~FU1(255) in the fuse blocks FB(0)~FB(255) are connected in series along the direction in which the word lines WL extend over the entire column decoder circuit CD1.

The decoder D(k) is constituted as a 4-input NAND gate to which input column address signals PY76, PY53, PY21 and PY0 are input. The output terminal of the decoder D(k) is connected to the redundancy control circuit RL(k) and also to the adjacent redundancy control circuit RL(k+1), so that an output signal YD(k+1) output by the decoder D(k) is input to the redundancy control circuits RL(k) and RL(k+1). The input column address signals PY76, PY53, PY21 and PY0 are pre-decoded signals. The input column address signal PY76 is a signal achieved by pre-decoding addresses 6 and 7 and has a 4-bit width. The input column address signal PY53 is a signal achieved by pre-decoding addresses 3~5 and has an 8-bit width. The input column address signal PY21 is a signal achieved by pre-decoding addresses 1 and 2 and has a 4-bit width. The input column address signal PY0 is a signal achieved by pre-decoding address 0 and has a 2-bit width. For instance, the lowest order bit among the four bits of the input column address signal PY76 is input to the decoders D(0), D(4), D(8), ..., D(252), the second bit maybe input to the decoders D(1), D(5), D(9), ..., D(253), the third bit is input to the decoders D(2), D(6), D(10), ..., D(254) and the highest-order bit is input to the decoders D(3), D(7), D(11), ..., D(255). Likewise, the individual bits in the input column address signals PY53, PY21 and PY0 are sequentially input to the decoders D(0)~D(255). In this structure, a single decoder D(k) corresponding to the column address is selected. It is to be noted that in the following explanation, a pre-decoded signal is referred to as an input column address signal.

The redundancy control circuit RL(k-1) (not shown), the redundancy control circuit RL(k) and the redundancy control circuit RL(k+1) are arranged over multiple stages along the direction in which the word lines WL extend, with redundancy selection signals RE(k) and REb(k) output by the redundancy control circuit RL(k-1) input to the redundancy control circuit RL(k) and redundancy selection signals RE(k+1) and REb(k+1) output by the redundancy control circuit RL(k) input to the redundancy control circuit RL(k+1). The redundancy control circuit RL(k) is connected with the column line driver DV1(k) which drives the column line CL(k) via a node DEC(k). Redundancy selection signals RE(0) and REb(0) input to the redundancy control circuit RL(0) are respectively set to the substrate voltage Vss and the source voltage Vcc.

Redundancy selection signals REr and RErb output by the redundancy control circuit RL(255) and an output signal YDr from the decoder D(255) are input to the auxiliary redundancy control circuit RLr. The redundancy control circuit RLr is connected to the column line driver DV1r that drives the auxiliary column line CLr via a node DECr.

The pre-charge circuit PC is connected to the fuse block FB(255) which corresponds to the column line CL(255) via fuse nodes F0c and F1c. The pre-charge circuit PC charges of the fuses FU0(0)~FU0(255) and the fuses FU1(0)~FU1(255) to the level of the source voltage Vcc when the levels of the input row address signals PX0 and PX1 are at the substrate voltage Vss.

The input row address signals PX0 and PX1 are input to the fuse driver FDV which is provided adjacent to the fuse block FB(0) corresponding to the column line CL(0). The output of the fuse driver FDV is connected to the fuse block FB(0) via fuse nodes F1(0) and F0(0). The fuse driver FDV sets the fuses FU0(0)~FU0(255) to the substrate voltage Vss if the level of the input row address signal PX0 is at the source voltage Vcc, and sets the fuses FU1(0)~FU1(255) to the substrate voltage Vss if the level of the input row address signal PX1 is at the source voltage Vcc.

Figure 8A:
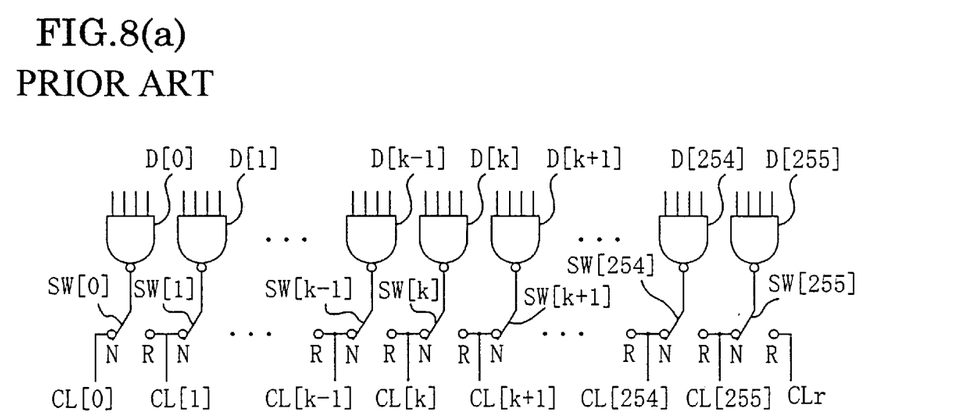
FIGS. 8a and 8b are a schematic diagrams of the operation performed in the column line decoder circuit in FIG. 7.
Figure 8B:
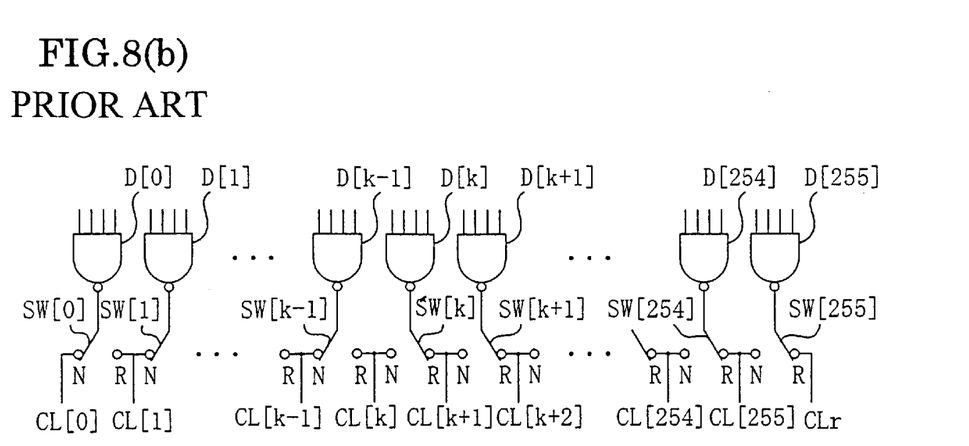

Next, the redundancy relief operation performed to correct a column line failure in the DRAM in the prior art is explained. FIG. 8(a) shows the column decoder circuit CD1 with all the column lines CL(0)~CL(255) operating in a normal state, and FIG. 8(b) illustrates the column decoder circuit CD1 with the column line CL(k) having an failure. In order to facilitate the explanation, the redundancy control circuits RL(0)~RL(255) are schematically shown as switches SW(0)~SW(255) respectively in the figures.

When all the column lines CL(0)~CL(255) are operating in a normal state, the fuses FU0(k) and the fuses FU1(k) in the fuse blocks FB(0)~FB(255) are not disconnected, and, as illustrated in FIG. 8(a), all the switches SW(0)~SW(255) are connected to the N terminals. Consequently, the output signals YD(0)~YD(255) output by the decoders D(0)~D(255) are respectively provided to the column lines CL(0)~CL(255).

If, on the other hand, there is a failure at the column line CL(k) and the other column lines CL(0)~CL(k−1) and CL(k+1)~CL(255) are operating in a normal state, the fuse FU0(k) in the fuse block FB(k) is disconnected, and as illustrated in FIG. 8(b), the switches SW(0)~SW(k−1) are connected to the N terminals with the switches SW(k)~SW(255) connected to the R terminals. As a result, the output signals YD(0)~YD(k−1) output by the decoders D(0)~D(k−1) are respectively provided to the column lines CL(0)~CL(k−1), the output signals YD(k)~YD(254) output by the decoders D(k)~D(254) are respectively provided to the column lines CL(k)~CL(255) and the output signal YD(255) output by the highest-order decoder D(255) is provided to the auxiliary column line CLr. Thus, the decoders in the higher-orders, starting with the decoder D(k), i.e., the decoders D(k)~D(255) are shifted upward by one order to be connected to the column lines CL(k+1)~CL(255) and the auxiliary column line CLr instead of the originally corresponding column lines CL(k)~CL(255), thereby achieving redundancy relief for the failure at the column line CL(k).

In the semiconductor memory in the prior art, in which the column decoder circuit CD1 is provided with the same number of fuse blocks FB(0)~FB(255) as the number of the column line drivers DV1(0)~DV1(255) with the fuse blocks and the column line drivers arranged in a single row along the direction in which the word lines WL extend as illustrated in FIG. 7, the pitch of the fuse blocks FB(0)~FB(255) and the pitch of the column line drivers DV1(0)~DV1(255) are equal to each other. In addition, since the pitch of the column line drivers DV1(0)~DV1(255) is equal to the pitch of the column lines CL(0)~CL(255), the fuse blocks FB(0)~FB(255) and the column lines CL(0)~CL(255) in the semiconductor memory in the prior art are laid out at the same pitch.

If the memory cell size is to be reduced and the layout pitch is to be shortened in order to achieve a larger capacity and higher integration in a semiconductor integrated circuit in the prior art, it becomes necessary to reduce the pitch of the column lines CL(0)~CL(255) accordingly, which, in turn, results in a reduction in the pitch of the fuse blocks FB(0)~FB(255). However, in order to disconnect the fuses FU0(k) and FU1(k) in the fuse block FB(k) in a stable manner by employing a laser repair apparatus or the like, for instance, a considerable distance must be allowed between the fuse block FB(k) and the adjacent fuse blocks FB(k−1) and FB(k+1). In other words, as a larger capacity and higher integration are achieved in the semiconductor memory in the prior art, a failure tends to occur more often when disconnecting a fuse, which poses a concern of a poor product yield.

In addition, in the redundancy relief achieved by the column decoder circuit CD1 in the semiconductor memory in the prior art, if there is a failure at the column line CL(k), for instance, the column line CL(k) is replaced by the adjacent column line CL(k+1). However, if two adjacent column lines CL(k) and CL(k+1) fail, redundancy relief cannot be achieved.

SUMMARY OF THE INVENTION

A first object of the present invention, which has been completed by addressing the problems of discussed above, is to provide a semiconductor memory capable of achieving redundancy relief even when adjacent column lines both fail.

A second object of the present invention is to provide a semiconductor memory capable of achieving redundancy relief on a column line failure in a stable manner while realizing a larger capacity and higher integration.

In order to achieve the objects described above, in a first aspect of the present invention, a semiconductor memory having a column line decoder circuit with a redundancy relief function is provided. The column line decoder circuit comprises n first decoders (n is an integer equal to or larger than 1) that output a SELECTED signal, n fuse blocks, each provided with a fuse that is disconnected in correspondence to a column line state, a redundancy control circuit group constituted of n+1 redundancy control circuits, with a (k+1)th redundancy control circuit (k is an integer equal to or larger than 1 and equal to or smaller than n) selecting either the SELECTED signal output by the kth first decoder or the SELECTED signal output by the (k+1)th first decoder among the n first decoders by employing the n fuse blocks and n+1 second decoder units that provide SELECTED signals selected by the individual redundancy control circuits to n+1 column line groups each constituted of two or more column lines.

By adopting this structure, it becomes possible to replace the two or more column lines in a given column line group with the two or more column lines in another column line group. If the two or more column lines constituting each column line group are provided successively along the direction in which the word lines extend, a redundancy relief can be achieved for column line failures even when column line failures ocher successively, i.e., failures occurring concurrently at adjacent column lines.

In addition, it is desirable to constitute each second decoder unit with two or more second decoders corresponding to the two or more column lines. Furthermore, the second decoders may be each constituted of a logic gate such as a NAND gate, an AND gate or the like.

In the second aspect of the present invention, a semiconductor memory having a column line decoder circuit comprising n decoders (n is an integer equal to or larger than 1) that output a SELECTED signal, n fuse blocks, each provided with a fuse that is disconnected in correspondence to a column line state and a redundancy control circuit group constituted of n+m (m is an integer equal to or larger than 1) redundancy control circuits, with a (k+m)th redundancy control circuit (k is an integer equal to or larger than 1 and equal to or smaller than n) selecting either the SELECTED signal output by a kth decoder or the SELECTED signal output by the (k+m)th decoder among the n decoders by employing the n fuse blocks to provide the SELECTED signal thus selected to the n+m column lines, is provided.

By adopting this structure, the kth column line among the m+n column lines can be replaced by the (k+m)th column line. Thus, a redundancy relief is achieved in correspondence to the column line failure occurrence pattern. For instance, if a failure is highly likely to occur at two successive column lines, it is desirable to set m=2 and replace the kth column line and the (k+1)th column line at which a failure occurs with the (k+2)th column line and the (k+3)th column line respectively and to replace the subsequent column lines starting with the (k+2)th column line with column lines starting with the (k+4)th column line.

Then, by providing the n fuse blocks over at least two stages along the direction in which the column lines extend, the fuse block space along the direction in which the word lines extend perpendicular to the column lines expands. Thus, the fuses provided in the fuse blocks can be disconnected with a higher degree of reliability.

In a third aspect of the present invention, a semiconductor memory having a column line decoder circuit comprising n first decoders (n is an integer equal to or larger than 1) that output a SELECTED signal, n fuse blocks, each provided with a fuse that is disconnected in correspondence to a column line state, a redundancy control circuit group constituted of n+m (m is an integer equal to or larger than 1) redundancy control circuits, with a (k+m)th redundancy control circuit (k is an integer equal to or larger than 1 and equal to or smaller than n) selecting either the SELECTED signal output by a kth first decoder or the SELECTED signal output by a (k+m)th first decoder among the n first decoders by employing the n fuse blocks and n+m second decoder units that provide SELECTED signals selected by the individual redundancy control circuits to n+m column line groups each constituted of two or more column lines is provided.

By adopting this structure, a kth column line group among the m+n column line groups can be replaced by a (k+m)th column line group. By providing the two or more column lines constituting each column line group continuously along the direction in which the word lines extend, a redundancy relief is achieved for column line failures occurring at successive column lines, i.e., even when failures occur at the same time at adjacent column lines.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

The following is a detailed explanation of the preferred embodiments of the semiconductor memory according to the present invention, given in reference to the attached drawings. It is to be noted that the same reference numbers are assigned to components achieving roughly identical functions and structural features in the following explanation and the attached drawings to preclude the necessity for repeated explanation thereof.

(First Embodiment)

The semiconductor memory in the first embodiment of the present invention assumes a structure achieved by replacing the column decoder circuit CD1 in the semiconductor memory in the prior art shown in FIG. 6 with a column decoder circuit CD11.

Figure 1:
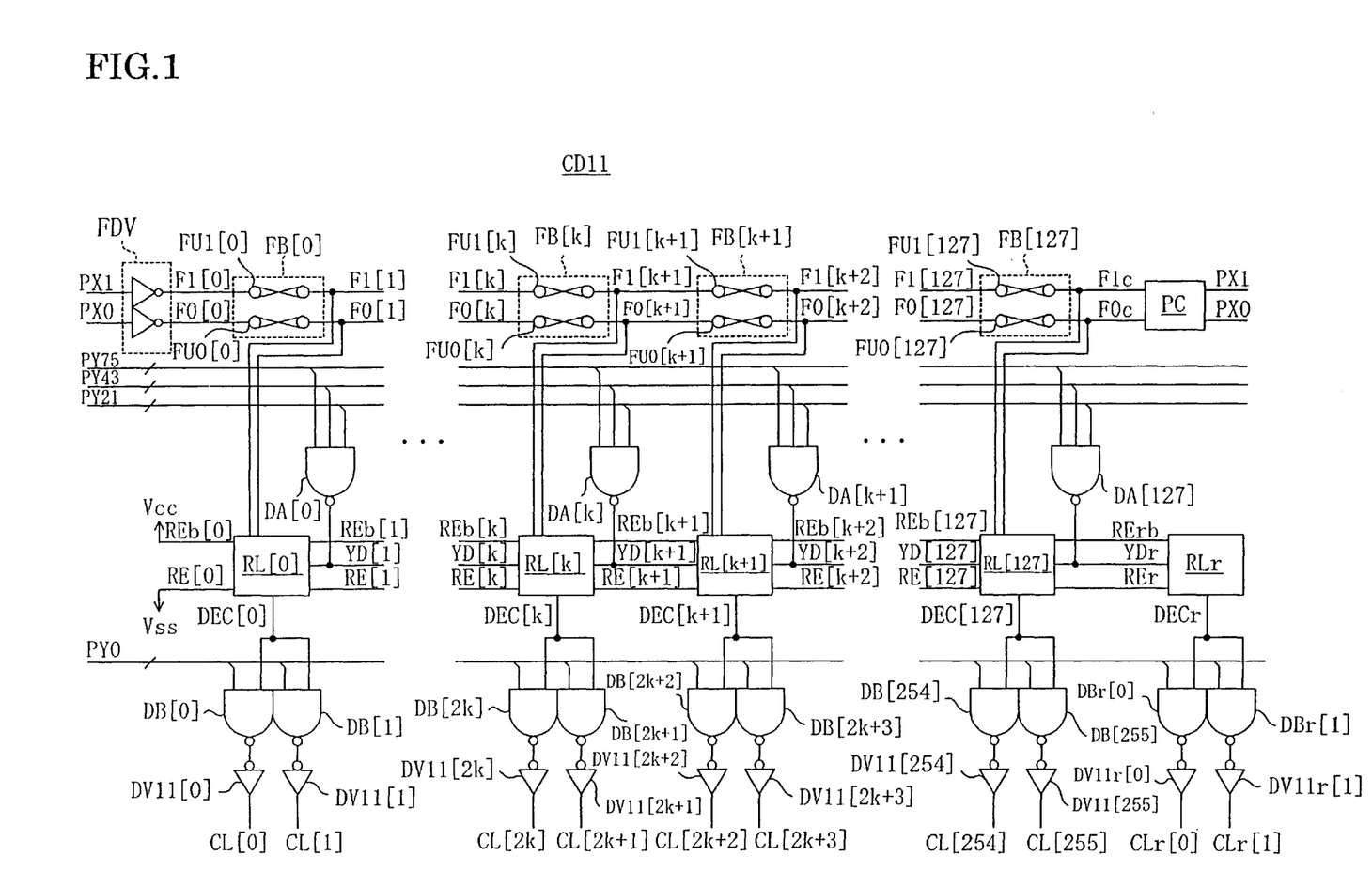
FIG. 1 is a circuit diagram illustrating the structure of the column line decoder circuit provided in the semiconductor memory in the first embodiment of the present invention.

FIG. 1 shows the column decoder circuit CD11 provided in the semiconductor memory in the first embodiment. The column decoder circuit CD1 is provided with fuse blocks FB(0), . . . , FB(k), . . . , FB(127), first decoders DA(0), . . . , DA(k), . . . , DA(127), redundancy control circuits RL(0), . . . , RL(k), . . . , RL(127), and RLr, second decoders DB(0), . . . , DB(2k), . . . , DB(255), DBr(0) and DBr(1), column line drivers DV11(0), . . . , DV11(2k), . . . , DV11(255), DV11r(0) and DV11r(1), a fuse driver FDV and a pre-charge circuit PC.

The fuse block FB(k) is provided with two fuses FU0(k) and FU1(k) that are independent of each other. The fuse FU0(k) and the fuse FU1(k) are connected to the redundancy control circuit RL(k) via a fuse node F0(k+1) and a fuse node F1(k+1) respectively. In addition, the fuse FU0(k) and the fuse FU1(k) are respectively connected to a fuse FU0(k+1) and a fuse FU1(k+1) in the adjacent fuse block FB(k+1) via the fuse node F0(k+1) and the fuse node F1(k+1). As a result, the fuses FU0(0)~FU0(127) and FU1(0)~FU1(127) in the fuse blocks FB(0)~FB(127) are connected in series along the direction in which the word lines WL extend over the entire column decoder circuit CD11.

The first decoder DA(k) is constituted as a 3-input NAND gate to which input column address signals PY75, PY43 and PY21 are input. The output terminal of the first decoder DA(k) is connected to the redundancy control circuit RL(k) and also the redundancy control circuit RL(k+1), so that an output signal YD(k+1) (SELECTED signal) output by the first decoder DA(k) is input to the redundancy control circuits RL(k) and RL(k+1).

The redundancy control circuit RL(k−1) (not shown), the redundancy control circuit RL(k) and the redundancy control circuit RL(k+1) are arranged over multiple stages along the direction in which the wordlines WL extend. Redundancy selection signals RE(k) and REb(k) output by the redundancy control circuit RL(k−1) are input to the redundancy control circuit RL(k) and redundancy selection signals RE(k+1) and REb(k+1) output by the redundancy control circuit RL(k) are input to the redundancy control circuit RL(k+1). The redundancy control circuit RL(k) is connected with the second decoders DB(2k) and DB(2k+1) via a node DEC(k).

The second decoders DB(2k) and DB(2k+1) are each constituted as a 2-input NAND gate with input column address signal PY0 input to one of its input terminals and the other input terminal connected with the node DEC(k). The output terminal of the second decoder DB(2k) is connected with the column line driver DV11(2k) that drives the column line CL(2k) and an output terminal of the second decoder DB(2k+1) is connected with a column line driver DV11(2k+1) that drives the column line CL(2k+1).

The levels of redundancy selection signals RE(0) and REb(0) input to the redundancy control circuit RL(0) are respectively set to the substrate voltage Vss and the source voltage Vcc.

Redundancy selection signals REr and RErb output by the redundancy control circuit RL(127) and the output signal YDr from the first decoder DA(127) are input to the auxiliary redundancy control circuit RLr. The redundancy control circuit RLr is connected to the second decoders DBr(0) and DBr(1) via a node DECr.

The second decoders DBr(0) and DBr(1) are each constituted as a 2-input NAND gate with the input column address signal PY0 input to one of its input terminals and the other input terminal connected with the node DECr. The output terminal of the second decoder DBr(0) is connected with the column line driver DV11r(0) that drives the auxiliary column line CLr(0) and an output terminal of the second decoder DBr(1) is connected with a column line driver DV11r(1) that drives an auxiliary column line CLr(1).

The pre-charge circuit PC is connected to a fuse block FB(127) which corresponds to the column line CL(255) and the column line CL(254) via fuse nodes F0c and F1c. The pre-charge circuit PC charges the fuses FU0(0)~FU0(127) and the fuses FU1(0)~FU1(127) to achieve the level of the source of voltage Vcc when input row address signals PX0 and PX1 are at the substrate voltage Vss.

The input row address signals PX0 and PX1 are input to the fuse driver FDV which is provided adjacent to the fuse block FB(0) corresponding to the column line CL(0) and the column line CL(1). The output of the fuse driver FDV is connected to the fuse block FB(0) via fuse nodes F1(0) and F0(0). The fuse driver FDV sets the fuses FU0(0)~FU0(127) to the substrate voltage Vss if the input row address signal PX0 is at the source voltage Vcc, and sets the fuses FU1 (0)~FU1(127) to the substrate voltage Vss if the input row address signal PX1 is at the source voltage Vcc.

Next, the circuit structures assumed by the fuse blocks FB(0)~FB(127) and the redundancy control circuits RL(0)~RL(127) and RLr are explained. As a typical example, the circuit structures of the fuse blocks FB(k−1), FB(k) and FB(k+1) and the redundancy control circuits RL(k−1), RL(k) and RL(k+1) are explained in reference to FIG. 2.

Figure 2:
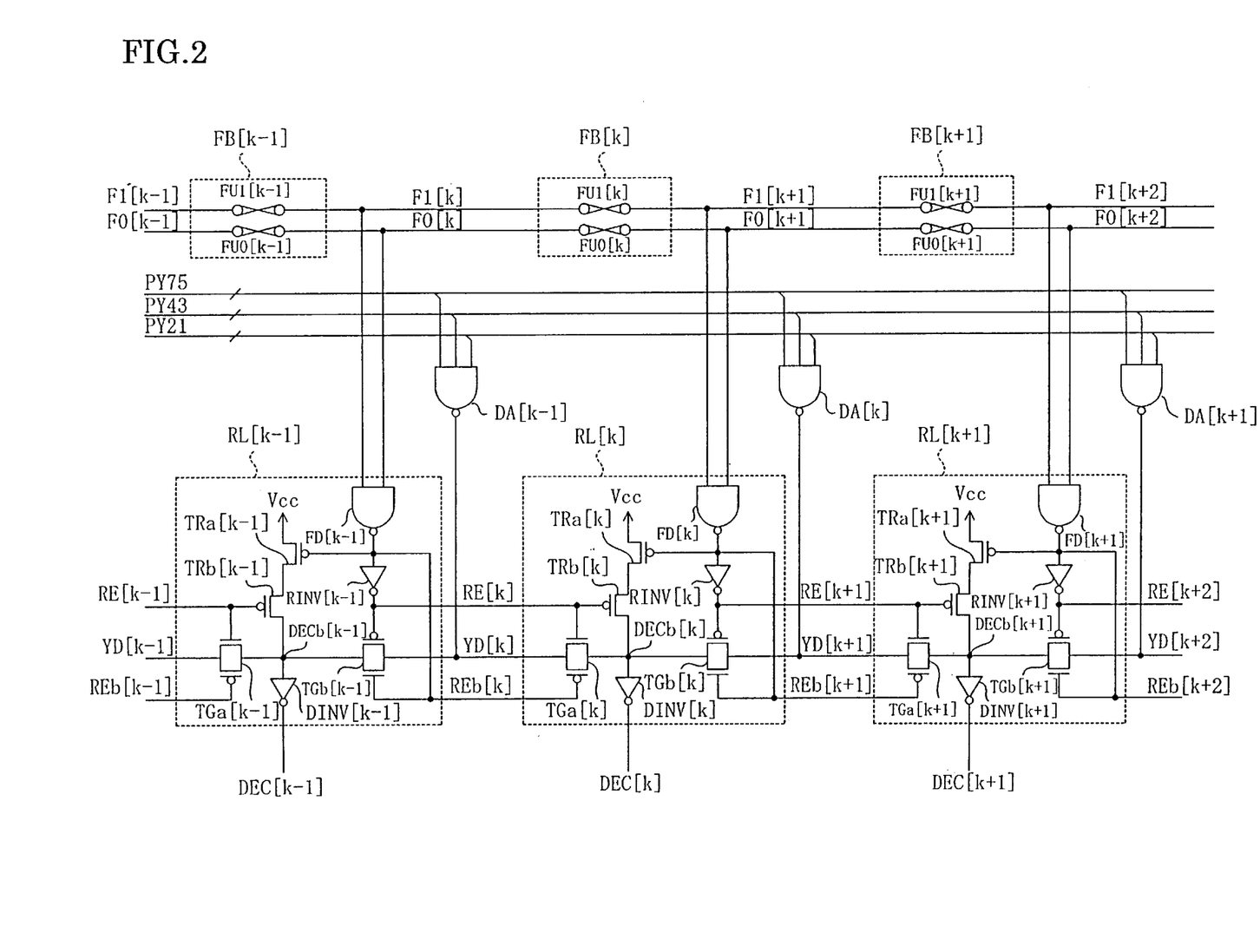
FIG. 2 is a circuit diagram illustrating the structures of the fuse blocks and the redundancy control circuits provided in the column line decoder circuit in FIG. 1.

The fuse block FB(k) is provided with two fuses FU1(k) and FU0(k) and redundancy relief of a failed column line is enabled by disconnecting of the fuses FU1(k) and FU0(k).

The fuses FU1(k) and FU0(k) in the fuse block FB(k) are connected at one end with the fuses FU1(k+1) and FU0(k+1) in the adjacent fuse block FB(k+1) via fuse nodes F1(k+1) and F0(k+1) respectively, and the other ends of the fuses FU1(k) and FU0(k) in the fuse block FB(k) are connected to the fuses FU1(k−1) and FU0(k−1) in the adjacent fuse block FB(k−1) via the fuse nodes F1(k) and F0(k) respectively.

The first decoder DA(k) is a 3-input NAND gate with the input column address signals PY75, PY43 and PY21 each input to one of its three input terminals and an output signal YD(k+1) output through its output terminal.

The redundancy control circuit RL(k) is constituted of a fuse decoder FD(k), inverters RINV(k) and DINV(k), transfer gates TGa(k) and TGb(k) and P-type transistors TRa(k) and TRb(k).

The fuse decoder FD(k) is a 2-input NAND gate with its two input terminals connected to the fuse nodes F0(k+1) and F1(k+1).

The redundancy selection signal REb(k+1) output by the fuse decoder FD(k) is input to the inverter RINV(k) which, in turn, outputs the redundancy selection signal RE(k+1).

The transfer gate TGa(k) is constituted of a P-type transistor and an N-type transistor, with the source of the P-type transistor connected to the source of the N-type transistor and the drain of the P-type transistor connected to the drain of the N-type transistor. The redundancy selection signal REb(k) is input to the gate of the P-type transistor, whereas the redundancy selection signal RE(k) is input to the gate of the N-type transistor. As a result, an operation to make a selection as to whether or not the output signal YD(k) output by the first decoder DA(k−1) is to be provided to the node DECb(k) is achieved by the transfer gate TGa(k) by using the redundancy selection signal REb(k) and the redundancy selection signal RE(k).

The transfer gate TGb(k) is constituted of a P-type transistor and an N-type transistor, with the source of the P-type transistor connected to the source of the N-type transistor and the drain of the P-type transistor connected to the drain of the N-type transistor. The redundancy selection signal RE(k+1) is input to the gate of the P-type transistor, whereas the redundancy selection signal REb(k+1) is input to the gate of the N-type transistor. As a result, an operation to make a selection as to whether or not the output signal YD(k+1) output by the first decoder DA(k) is to be provided to the node DECb(k) is achieved by the transfer gate TGb(k) by using the redundancy selection signal RE(k+1) and the redundancy selection signal REb(k+1).

The source of the P-type transistor TRa(k) is connected to the source Vcc and the drain of the P-type transistor TRa(k) is connected to the source of the P-type transistor TRb(k). The drain of the P-type transistor TRb(k) is connected to the node DECb(k). The gate of the P-type transistor TRa(k) is connected to the output terminal of the fuse decoder FD(k) in the same redundancy control circuit RL(k) so that ON/OFF control of the P-type transistor TRa(k) is achieved by the redundancy selection signal REb(k+1) output by the fuse decoder FD(k). The gate of the P-type transistor TRb(k) is connected to the output terminal of the inverter RINV(k−

1) in the redundancy control circuit RL(k−1) at the preceding stage so that ON/OFF control of the P-type transistor TRb(k) is achieved by the redundancy selection signal RE(k) output by the inverter RINV(k−1).

The input terminal of the inverter DINV(k) is connected to the node DECb(k), and the output terminal of the inverter DINV(k) is connected to the node DEC(k).

As described above, the redundancy control circuit RL(k) selects either the output signal YD(k) output by the first decoder DA(k−1) or the output signal YD(k+1) output by the first decoder DA(k) in conformance to the redundancy selection signals RE(k) and REb(k) output by the adjacent redundancy control circuit RL(k−1) and the redundancy selection signals RE(k+1) and REb(k+1) generated in the redundancy control circuit RL(k) itself, and outputs the selected signal to the node DEC(k) via the inverter DINV(k).

Figure 3A:
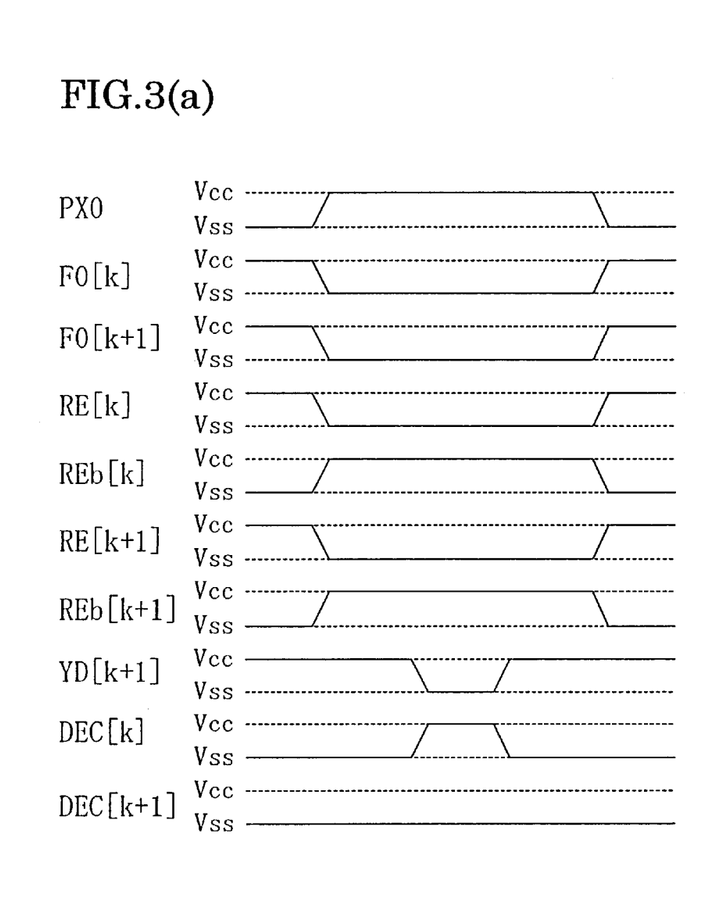
FIGS. 3a and 3b are timing charts of the operation achieved in the column line decoder circuit in FIG. 1.
Figure 3B:
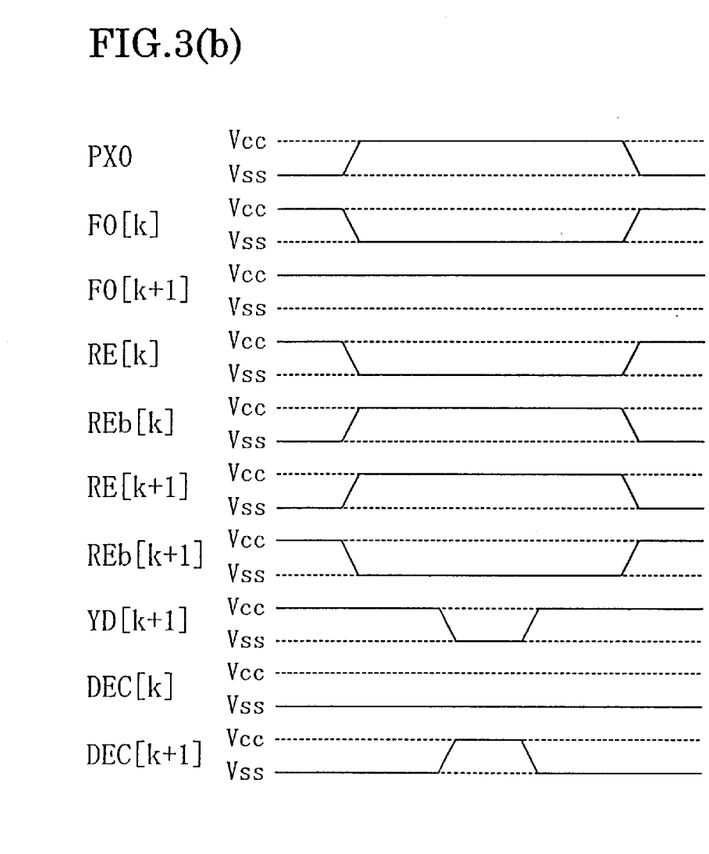

Next, the operation achieved in the column decoder circuit CD11 provided in the semiconductor memory in the first embodiment is explained in reference to FIG. 3.

FIG. 3(a) is a time chart of the operation performed by the column decoder circuit CD11 when all the column lines CL(0)~CL(255) are operating in a normal state and FIG. 3(b) is a timing chart of the operation performed by the column decoder circuit CD11 when a failure occurs at, at least, either the column line CL(2k) or the column line CL(2k+1) among the column lines CL(0)~CL(255).

In the case illustrated in FIG. 3(a), i.e., when all the column lines CL(0)~CL(255) are operating in a normal state, none of the fuses FU0(0)~FU0(255) are disconnected, and as the level of the input row address signal PX0 shifts to the source voltage Vcc, the fuse nodes FU0(0)~FU0(255) connected in series to the fuse driver FDV are set to the substrate voltage Vss.

For instance, as the level at the fuse node F0(k+1) shifts to the substrate voltage Vss, the redundancy selection signal REb(k+1) output by the fuse decoder FD(k) in the redundancy control circuit RL(k) is set to the source voltage Vcc and the redundancy selection signal RE(k+1) output by the inverter RINV(k) is set to the substrate voltage Vss. Thus, the transfer gate TGa(k) is turned off and the transfer gate TGb(k) is tuned on. Consequently, the output signal YD(k+1) output by the first decoder DA(k) is provided to the node DECb(k).

As the first decoder DA(k) is selected by the input column address signals PY75, PY43 and PY21 during this process, the level at the node DECb(k) is set to the substrate voltage Vss by the output signal YD(k+1) output by the first decoder DA(k). Then, the inverter DINV(k), whose input terminal is connected to the node DECb(k), drives the node DEC(k) to achieve a level equal to the source voltage Vcc.

As shown in FIG. 1, the node DEC(k) is connected with the second decoder DB(2k) and the second decoder DB(2k+1). When the second decoders DB(2k) and DB(2k+1) are selected by the input column address signal PY0, the column line drivers DV11(2k) and DV11(2k+1) enter an active state to set the levels at the column line CL(2k) and CL(2k+1) to the source voltage Vcc.

The operation by the column decoder circuit CD11 is performed as described above when all the column lines CL(0)~CL(255) are operating in a normal state. Now, the operation performed in the column decoder circuit CD11 when there is a failure at the column line CL(2k) is explained in reference to FIG. 3(b).

First, in order to achieve a redundancy relief for the failure of the column line CL(2k) in the semiconductor memory in the first embodiment, the fuse FU0(k) in the fuse block FB(k) is disconnected. As a result, the fuse node F0(k+1) becomes cut off from the fuse driver FDV.

As the level of the input row address signal PX0 shifts to the source voltage Vcc, the fuse nodes F0(0), F0(1), . . . , F0(k) connected to the fuse driver FDV are set to the substrate voltage Vss and the fuse nodes F0(k+1), . . . , F0(127) and F0c cut off from the fuse driver FDV are set to the source voltage Vcc by the precharge circuit. This causes the redundancy control circuits RL(0), . . . , RL(k−1) connected to the fuse nodes F0(1), . . . , F0(k) and the redundancy control circuits RL(k), . . . , RL(126) and RL(127) connected to the fuse nodes F0(k+1), . . . , F0(127) and F0c to engage in different operations.

The operation of the lower-order redundancy control circuits RL(0), . . . , RL(k−1) is identical to that performed when all the column lines CL(0)~CL(255) are operating in a normal state explained earlier in reference to FIG. 3(a). The operation performed by the higher-order redundancy control circuits RL(k), . . . , RL(127) and RLr is explained below.

As explained above, with the fuse FU0(k) disconnected, the level at the fuse node F0(k+1) is set to the source voltage Vcc. As a result, the level of the redundancy selection signal REb(k+1) output by the fuse decoder FD(k) of the redundancy control circuit RL(k) connected to the fuse node F0(k+1) is set to the substrate voltage Vss and the redundancy selection signal RE(k+1) output by the inverter RINV (k) is set to the source voltage Vcc. With the voltage levels of the redundancy selection signal REb(k+1) and the redundancy selection signal RE(k+1) set in this manner, the transfer gate TGb(k) is turned off and the transfer gate TGa(k+1) is turned on. Thus, the output signal YD(k+1) output by the first decoder DA(k) is provided to the node DECb(k+1) of the redundancy control circuit RL(k+1).

During this process, as the first decoder DA(k) is selected by the input column address signals PY75, PY43 and PY21, the output signal YD(k+1) output by the first decoder DA(k) sets the level at the node DECb(k+1) in the redundancy control circuit RL(k+1) to the substrate voltage Vss. Then, the inverter DINV(k+1) sets the level at the node DEC(k+1) which constitutes the output node of the redundancy control circuit RL(k+1) to the source voltage Vcc.

As illustrated in FIG. 1, the node DEC(k+1) is connected to the second decoder DB(2k+2) and the second decoder DB(2k+3). When these second decoders DB(2k+2) and DB(2k+3) are selected by the input column address signal PY0, the column line drivers DV11(2k+2) and DV11(2k+3) enter an active state, thereby setting the voltage levels at the column lines CL(2k+2) and CL(2k+3) to the source voltage Vcc.

As explained above, the first decoder DA(k) which selects the column lines CL(2k) and CL(2k+1) when the fuse FU0(k) is not disconnected, selects the column lines CL(2k+2) and CL(2k+3) when the fuse FU0(k) is disconnected. In other words, the failed column line CL(2k) and the adjacent column line CL(2k+1) are respectively replaced by the column lines CL(2k+2) and CL(2k+3). Likewise, the column lines CL(2k+2)~CL(253) are replaced by the column lines CL(2k+4)~CL(255) respectively, which are higher-order column lines relative to them by two addresses. Then, the column lines CL(254) and CL(255) are respectively replaced by the auxiliary column lines CLr(0) and CLr(1).

The redundancy selection signals REb(k) and RE(k) generated in the redundancy control circuit RL(k−1) are respectively set to the source voltage Vcc and the substrate voltage Vss since the F0(k) is at the substrate voltage Vss. With the voltage levels of the redundancy selection signals REb(k) and RE(k) set in this manner, the transfer gate TGb(k−1) is turned on and the transfer gate TGa(k) is turned off. As a result, neither the output signal YD(k) output by the first decoder DA(k−1) or the output signal YD(k+1) output by the first decoder DA(k) is provided to the node DECb(k) in the redundancy control circuit RL(k). Since the redundancy selection signal REb(k+1) sets the P-type transistor TRa(k) in an ON state and the redundancy selection signal RE(k) sets the P-type transistor TRb(k) in an ON state, the node DECb(k) is set to the source voltage Vcc and the node DEC(k) which is the output node of the redundancy control circuit RL(k) is set to the substrate voltage Vss via the inverter DINV(k).

With the node DEC(k) set to the substrate voltage Vss, the failed column line CL(2k) is held at the substrate voltage Vss by the second decoder DB(2k) and the inverter DV11 (2k) and the column line CL(2k+1), too, is held at the substrate voltage Vss by the second decoder DB(2k+1) and the inverter DV11(2k+1). In otherworld, with the fuse FU0(k) disconnected, the failed column line CL(2k) and the adjacent column line CL(2k+1) are set in an inactive state, thereby achieving a redundancy relief for the failure of the column line CL(2k).

As explained above, in the semiconductor memory in the first embodiment of the present invention, one fuse block FB(k) and one redundancy control circuit RL(k) are assigned to the two column lines CL(2k) and CL(2k+1), and thus, the pitch of the fuse blocks FB(0)~FB(127) can be set twice the pitch of the column lines CL(0)~CL(255). As a result, even if the pitch of the column lines CL(0)~CL(255) is reduced, the fuse blocks FB(0)~FB(127) are laid out at a pitch that is large enough to allow the internal fuses to be disconnected with accuracy. With the fuse blocks FB(0)~FB(127) laid out with sufficient space margin in this manner, failed disconnection of fuses is minimized, to achieve an improvement in the product yield of the semiconductor memory.

When a failure occurs at the column line CL(2k) during the semiconductor memory manufacturing process, a failure may also occur at the adjacent column line CL(2k+1). Redundancy relief cannot be achieved by employing the column decoder circuit CD1 in the semiconductor memory in the prior art illustrated in FIG. 7 if two adjacent column lines CL fail. In contrast, in the semiconductor memory in the first embodiment in which the column line CL(2k) and the adjacent column line CL(2k+1) are together replaced by the column lines CL(2k+2) and CL(2k+3) respectively by employing the column decoder circuit CD11, a redundancy relief is achieved even when adjacent column lines are both failed to achieve a further improvement in product yield.

(Second Embodiment)

The semiconductor memory in the second embodiment of the present invention assumes a structure achieved by replacing the column decoder circuit CD1 in the semiconductor memory in the prior art shown in FIG. 6 with a column decoder circuit CD12.

Figure 4:
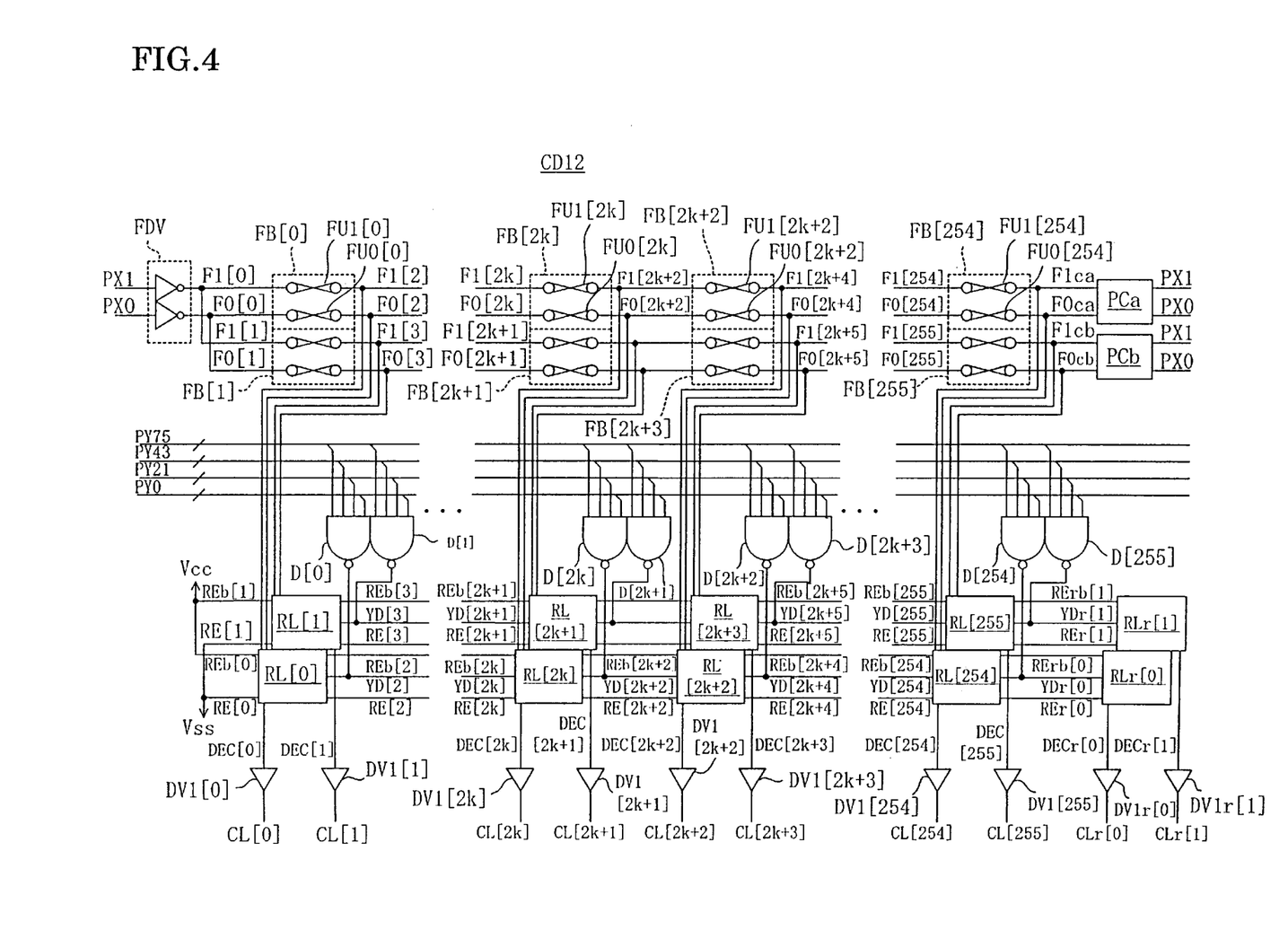
FIG. 4 is a circuit diagram illustrating the structure of the column line decoder circuit provided in the semiconductor memory in the second embodiment of the present invention.

FIG. 4 shows the column decoder circuit CD12 provided in the semiconductor memory in the second embodiment. The column decoder circuit CD12 is provided with fuse blocks FB(0), . . . , FB(2k), . . . , FB(255), decoders D(0), . . . , D(2k), . . . , D(255), redundancy control circuits RL(0), . . . , RL(2k), . . . , RL(255), RLr(0) and RLr(1), column line drivers DV1(0), . . . , DV1(2k), . . . , DV1(255), DV1r(0) and DV1r(1), a fuse driver FDV and pre-charge circuits PCa and PCb.

The fuse blocks FB(0)~FB(255) and the redundancy control circuits RL(0)~RL(255) are both divided into an even-numbered column group and an odd-numbered column group. The even-numbered column group includes the fuse blocks FB(0), FB(2), . . . , FB(2k), FB(2k+2), . . . , FB(254) and the redundancy control circuits RL(0), RL(2), . . . , RL(2k), RL(2k+2), . . . , RL(254), whereas the odd-numbered column group includes the fuse blocks FB(1), FB(3), . . . , FB(2k+1), FB(2k+3), . . . , FB(255) and the redundancy control circuits RL(1), RL(3), . . . , RL(2k+1), RL(2k+3), . . . , RL(255).

The fuse block FB(2k) in the even-numbered column group is provided with two fuses FU0(2k) and FU1(2k) that are independent of each other. The fuse FU0(2k) and the fuse FU1(2k) are connected to the redundancy control circuit RL(2k) via a fuse node F0(2k+2) and a fuse node F1(2k+2) respectively. In addition, the fuse FU0(2k) and the fuse FU1(2k) are respectively connected to a fuse FU0(2k+2) and a fuse FU1(2k+2) in the adjacent fuse block FB(2k+2) via the fuse node F0(2k+2) and the fuse node F1(2k+2). As a result, the fuses FU0(0), FU0(2), . . . , FU0(254) and the fuses FU1(0), FU1(2), . . . , FU1(254) provided at the fuse blocks FB(0), FB(2), . . . , FB(254) in the even-numbered column group are connected in series along the direction in which the word lines WL extend over the entire column decoder circuit CD12.

In addition, the fuse blocks FB(1), FB(3), . . . , FB(255) in the odd-numbered column group, too, are each provided with two fuses independent of each other, with the individual fuses connected in series along the direction in which the word lines WL extend over the entire column decoder circuit CD12. The two fuses provided in the fuse block FB(2k+3), for instance, are both connected to the redundancy control circuit RL(2k+3) via a fuse node F0(2k+5) and a fuse node Fl(2k+5) respectively.

The decoder D(2k) is constituted as a 4-input NAND gate to which input column address signals PY75, PY43, PTY21 and PY0 are input. The output terminal of the decoder D(2k) is connected to the redundancy control circuit RL(2k) and also to the redundancy control circuit RL(2k+2), so that an output signal YD(2k+2) output by the decoder D(2k) is input to the redundancy control circuits RL(2k) and RL(2k+2).

The redundancy control circuit RL(2k−2) (not shown), the redundancy control circuit RL(2k) and the redundancy control circuit RL(2k+2) in the even-numbered column group are arranged over multiple stages along the direction in which the word lines WL extend, with the redundancy selection signals RE(2k) and REb(2k) output by the redundancy control circuit RL(2k−2) input to the redundancy control circuit RL(2k) and redundancy selection signals RE(2k+2) and REb(2k+2) output by the redundancy control circuit RL(2k) input to the redundancy control circuit RL(2k+2). The redundancy control circuit RL(2k) is connected to the column line driver DV1(2k) that drives the column line CL(2k) via the node DEC(2k).

Likewise, the redundancy control circuit RL(2k−1) (not shown), the redundancy control circuit RL(2k+1) and the redundancy control circuit RL(2k+3) in the odd-numbered column group are arranged over multiple stages along the direction in which the word lines WL extend, with the redundancy selection signals RE(2k+1) and REb(2k+1) output by the redundancy control circuit RL(2k−1) input to the redundancy control circuit RL(2k+1) and redundancy selection signals RE(2k+3) and REb(2k+3) output by the redundancy control circuit RL(2k+1) input to the redundancy control circuit RL(2k+3). The redundancy control circuit RL(2k+1) is connected to the column line driver DV1(2k+1) that drives the column line CL(2k+1) via the node DEC(2k+1).

The redundancy selection signals RE(0) and RE(1) respectively input to the redundancy control circuits RL(0)

and RL(1) are set to the substrate voltage Vss, and the redundancy selection signals REb(0) and REb(1) respectively input to redundancy control circuits RL(0) and RL(1) are set to the source voltage Vcc.

Redundancy selection signals REr(0) and RErb(0) output by the redundancy control circuit RL(254) and the output signal YDr(0) from the decoder D(254) are input to the auxiliary redundancy control circuit RLr(0), whereas the redundancy selection signals REr(1) and RErb(1) output by the redundancy control circuit RL(255) and the output signal YDr(1) from the decoder D(255) are input to the auxiliary redundancy control circuit RLr(1). Also, the redundancy control circuit RLr(0) is connected to the column line driver DV1r(0) that drives the auxiliary column line CLr(0) via the node DECr(0) and the redundancy control circuit RLr(1) is connected to the column line driver DV1r(1) that drives the auxiliary column line CLr(1) via the node DECr(1).

The pre-charge circuit PCa is connected to the fuse block FB(254) which corresponds to the column line CL(254) via fuse nodes F0ca and F1ca and the pre-charge circuit PCb is connected to the fuse block FB(255) which corresponds to the column line CL(255) and the column line CL(254) via fuse nodes F0cb and F1cb. The pre-charge circuits PCa and PCb charge the fuses FU0(0)~FU0(255) and the fuses FU1(0)~FU1(255) to the level of the source voltage Vcc when input row address signals PX0 and PX1 are at the substrate voltage Vss.

The input row address signals PX0 and PX1 are input to the fuse driver FDV which is provided adjacent to the fuse block FB(0) corresponding to the column line CL(0) and the fuse block FB(1) corresponding to the column line CL(1). The output of the fuse driver FDV is connected to the fuse block FB(0) via fuse nodes F1(0) and F0(0), and is also connected to the fuse block FB(1) via fuse nodes F1(1) and F0(1). The fuse driver FDV sets the fuses FU0(0)~FU0(255) to the substrate voltage Vss if the input row address signal PX0 is at the source voltage Vcc, and sets the fuses FU1(0)~FU1(255) to the substrate voltage Vss if the input row address signal PX1 is at the source voltage Vcc.

As explained above, in the column decoder circuit CD12 in the semiconductor memory in the second embodiment, the fuse blocks FB(0)~FB(255) and the redundancy control circuits RL(0)~RL(255) are divided into an even-numbered column group and an odd-numbered column group, and this grouping is the primary feature of the column decoder circuit CD12. The fuse blocks FB(0), FB(2), ..., FB(2k), FB(2k+2), ..., FB(254) in the even-numbered column group and the fuse blocks FB(1), FB(3), ..., FB(2k+1), FB(2k+3), ..., FB(255) in the odd-numbered column group are laid out over two stages in the direction in which the column lines CL extend. Likewise, the redundancy control circuits RL(0), RL(2), ..., RL(2k), RL(2k+2), ..., RL(254) in the even-numbered column group and the redundancy control circuits RL(1), RL(3), ..., RL(2k+1), RL(2k+3), ..., RL(255) in the odd-numbered column group are also laid out over two stages in the direction in which the column lines CL extend.

By adopting this structure, the space in the fuse blocks FB(0)~FB(255) along the direction in which the word lines WL extend is expanded to double the size of the space available in the prior art. Thus, as in the semiconductor memory in the first embodiment, even if the pitch of the column lines CL(0)~CL(255) is reduced, the fuse blocks FB(0)~FB(255) are laid out with a pitch that is large enough to allow the internal fuses to be disconnected with accuracy. Since the fuse blocks FB(0)~FB(255) are laid out with enough space margin in this manner, a failed fuse disconnection is minimized to achieve an improvement in product yield of the semiconductor memory.

Next, the operation achieved by the column decoder circuit CD12 in the semiconductor memory in the second embodiment to achieve a redundancy relief is explained.

By employing the column decoder circuit CD12, a redundancy relief is achieved for adjacent two column lines CL independently of each other. In more specific terms, the column line CL(2k) controlled by the redundancy control circuit RL(2k) in the even-numbered column group is replaced by the column line CL(2k+2) which is controlled by the redundancy control circuit RL(2k+2) also belonging in the even-numbered column group, and the column line CL(2k+1) controlled by the redundancy control circuit RL(2k+1) in the odd-numbered column group is replaced by the column line CL(2k+3) which is controlled by the redundancy control circuit RL(2k+3) also belonging in the odd-numbered column group.

Now, the redundancy relief operation performed by the column decoder circuit CD12 is explained by using an example in which there is a failure at the column line CL(2k).

First, in order to achieve a redundancy relief for a failure at the column line CL(2k) in the semiconductor memory in the second embodiment, the fuse FU0(2k) provided in the fuse block FB(2k) is disconnected. This cuts off the fuse node F0(2k+2) from the fuse driver FDV, and sets the level at the fuse node F0(2k+2) to the source voltage Vcc. As a result, the output terminal of the decoder D(2k) and the node DECb(2k+2) of the redundancy control circuit RL(2k+2) become electrically continuous.

As the decoder D(2k) is selected by the input column address signals PY75, PY43, PY21 and PY0, the output signal YD(2k+2) output by the decoder D(2k) sets the voltage level at the node DECb(2k+2) of the redundancy control circuit RL(2k+2) to the substrate voltage Vss. Then, the inverter DINV(2k+2) whose input terminal is connected to the node DECb(2k+2) sets the voltage level at the node DEC(2k+2) to the source voltage Vcc, and the column line driver DV1(2k+2) whose input terminal is connected to the node DEC(2k+2) drives the column line CL(2k+2) to the level of the source voltage Vcc.

Thus, the failed column line CL(2k) is replaced by the column line CL(2k+2) which is two addresses ahead.

In the column decoder circuit CD1 shown in FIG. 7 provided in the semiconductor memory in the prior art, a redundancy relief cannot be achieved if, for instance, there are failures at the column line CL(k) and at the adjacent column line CL(k+1). In contrast, in the semiconductor memory in the second embodiment, the column line CL(2k) and the adjacent column line CL(2k+1), for instance, can be separately replaced by the column line CL(2k+2) and the column line CL(2k+3) respectively. In addition, unlike the column decoder circuit CD11 provided in the semiconductor memory in the first embodiment, the column decoder circuit CD12 allows the column line CL(2k+1) and the adjacent column line CL(2k+2) that have both failed to be replaced by the column line CL(2k+3) and the column line CL(2k+4) respectively. Consequently, by employing the semiconductor memory in the second embodiment, it is possible to achieve a redundancy relief for failures at the column lines CL that occur in various patterns with a higher degree of flexibility.

(Third Embodiment)

The semiconductor memory in the third embodiment of the present invention assumes a structure achieved by replacing the column decoder circuit CD1 in the semiconductor memory in the prior art shown in FIG. 6 with a column decoder circuit CD13.

Figure 5:
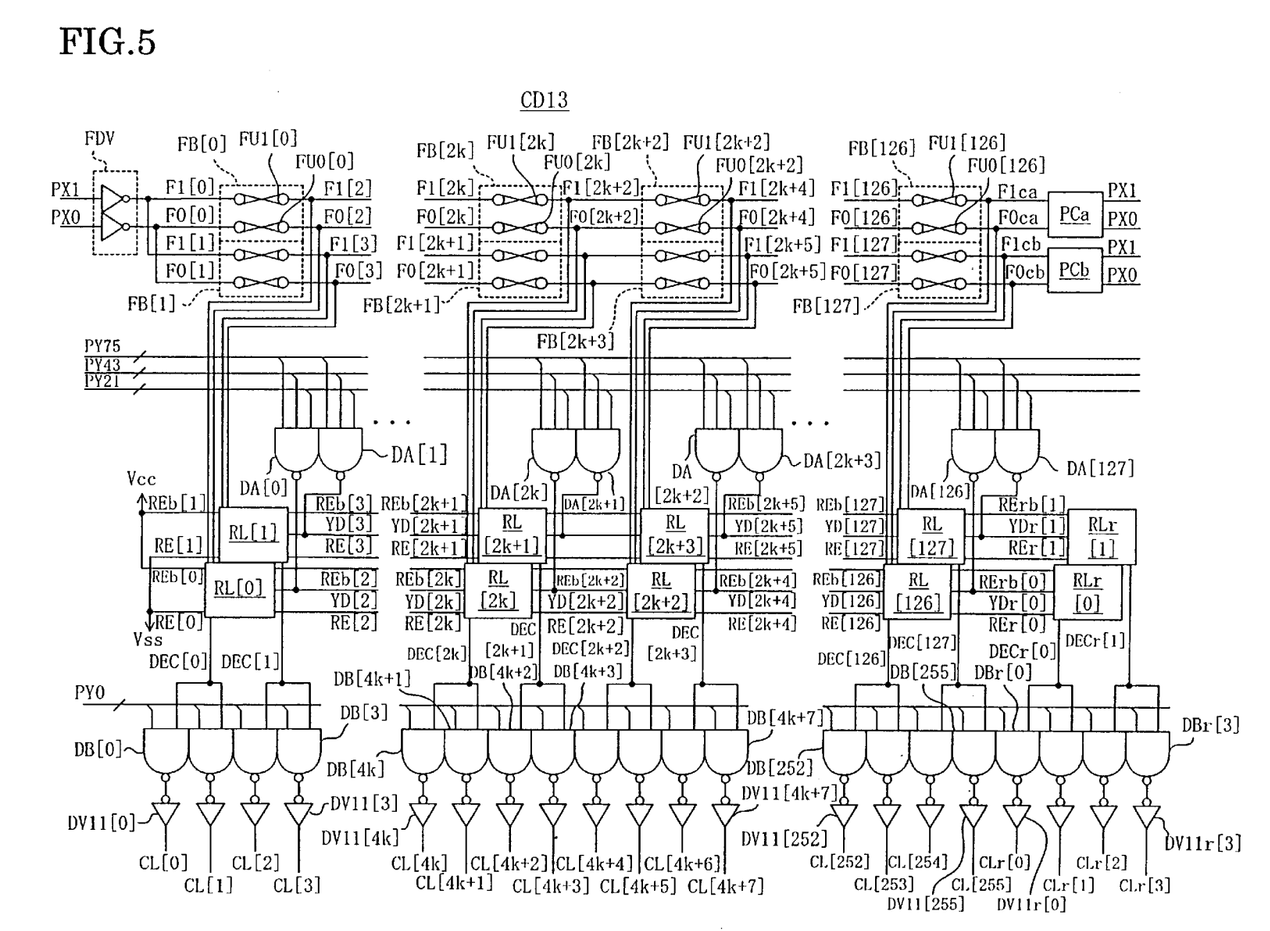
FIG. 5 is a circuit diagram illustrating the structure of the column line decoder circuit provided in the semiconductor memory in the third embodiment of the present invention.

FIG. 5 shows the column decoder circuit CD13 provided in the semiconductor memory in the third embodiment. The column decoder circuit CD13 is provided with fuse blocks FB(0), ..., FB(2k), ..., FB(127), first decoders DA(0), ..., DA(2k), ..., DA(127), redundancy control circuits RL(0), ..., RL(2k), ..., RL(127), RLr(0) and RLr(1), second decoders DB(0), ..., DB(4k), ..., DB(255) and DBr(0), ... DBr(3), column line drivers DV11(0), ..., DV11(4k), ..., DV11(255) and DV11r(0), ..., DV11r(3), a fuse driver FDV and pre-charge circuits PCa and PCb.

The fuse blocks FB(0)~FB(127) and the redundancy control circuits RL(0)~RL(127) are divided into an even-numbered column group and an odd-numbered column group. The even-numbered column group includes the fuse blocks FB(0), FB(2), ..., FB(2k), FB(2k+2), ..., FB(126) and the redundancy control circuits RL(0), RL(2), ..., RL(2k), RL(2k+2), ..., RL(126), whereas the odd-numbered column group includes the fuse blocks FB(1), FB(3), ..., FB(2k+1), FB(2k+3), ..., FB(127) and the redundancy control circuits RL(1), RL(3), ..., RL(2k+1), RL(2k+3), ..., RL(127).

The fuse block FB(2k) in the even-numbered column group is provided with two fuses FU0(2k) and FU1(2k) that are independent of each other. The fuse FU0(2k) and the fuse FU1(2k) are connected to the redundancy control circuit RL(2k) via a fuse node F0(2k+2) and a fuse node F1(2k+2) respectively. In addition, the fuse FU0(2k) and the fuse FU1(2k) are respectively connected to a fuse FU0(2k+2) and a fuse FU1(2k+2) in the adjacent fuse block FB(2k+2) via the fuse node F0(2k+2) and the fuse node F1(2k+2). As a result, the fuses FU0(0)~FU0(126) and the fuses FU1(0)~FU1(126) provided at the fuse blocks FB(0)~FB(126) in the even-numbered column group are connected in series along the direction in which the word lines WL extend over the entire column decoder circuit CD13.

Likewise, the fuse blocks FB(1), FB(3), ..., FB(127) in the odd-numbered column group are each provided with two fuses independent of each other with the individual fuses connected in series along the direction in which the word lines WL extend over the entire column decoder circuit CD13. The two fuses provided in the fuse block FB(2k+3), for instance, are both connected to the redundancy control circuit RL(2k+3) via a fuse node F0(2k+5) and a fuse node F1(2k+5) respectively.

The first decoder DA(2k) is constituted as a 3-input NAND gate to which input column address signals PY75, PY43 and PY21 are input. The output terminal of the first decoder DA(2k) is connected to the redundancy control circuit RL(2k) and also the redundancy control circuit RL(2k+2), so that an output signal YD(2k+2) output by the first decoder DA(2k) is input to the redundancy control circuits RL(2k) and RL(2k+2).

The redundancy control circuit RL(2k−2) (not shown), the redundancy control circuit RL(2k) and the redundancy control circuit RL(2k+2) in the even-numbered column group are arranged over multiple stages along the direction in which the word lines WL extend, with redundancy selection signals RE(2k) and REb(2k) output by the redundancy control circuit RL(2k−2) input to the redundancy control circuit RL(2k) and redundancy selection signals RE(2k+2) and REb(2k+2) output by the redundancy control circuit RL(2k) input to the redundancy control circuit RL(2k+2). The redundancy control circuit RL(2k) is connected to the second decoder DB(4k) and the adjacent second decoder DB(4k+1) via a node DEC(2k).

The second decoders DB(4k) and DB(4k+1) are each constituted as a 2-input NAND gate with an input column address signal PY0 input to one of its input terminals and the other input terminal connected to the node DEC(2k). The output terminal of the second decoder DB(4k) is connected to the column line driver DV11(4k) that drives the column line CL(4k) and the output terminal of the second decoder DB(4k+1) is connected to the column line driver DV11(4k+1) that drives the column line CL(4k+1).

The redundancy control circuit RL(2k−1) (not shown), the redundancy control circuit RL(2k+1) and the redundancy control circuit RL(2k+3) in the odd-numbered column group are arranged over multiple stages along the direction in which the word lines WL extend, with redundancy selection signals RE(2k+1) and REb(2k+1) output by the redundancy control circuit RL(2k−1) input to the redundancy control circuit RL(2k+1) and redundancy selection signals RE(2k+3) and REb(2k+3) output by the redundancy control circuit RL(2k+1) input to the redundancy control circuit RL(2k+3). The redundancy control circuit RL(2k+1) is connected to the second decoder DB(4k+2) and the adjacent second decoder DB(4k+3) via a node DEC(2k+1).

The second decoders DB(4k+2) and DB(4k+3) are each constituted as a 2-input NAND gate with the input column address signal PY0 input to one of its input terminals and the other input terminal connected to the node DEC(2k+1). The output terminal of the second decoder DB(4k+2) is connected to the column line driver DV11 (4k+2) that drives the column line CL(4k+2) and the output terminal of the second decoder DB(4k+3) is connected to the column line driver DV11(4k+3) that drives the column line CL(4k+3).

Redundancy selection signals RE(0) and RE(1) and the redundancy selection signals REb(0) and REb(1) input to the redundancy control circuits RL(0) and RL(1) are respectively set to the substrate voltage Vss and the source voltage Vcc.

Redundancy selection signals REr(0) and RErb(0) output by the redundancy control circuit RL(126) and the output signal YDr(0) from the first decoder DA(126) are input to the auxiliary redundancy control circuit RLr(0). The redundancy selection signals REr(1) output by the redundancy control circuit RL(127) and the output signal YDr(1) from the first decoder DA(127) are input to the auxiliary redundancy control circuit RLr(1). In addition, the redundancy control circuit RLr(0) is connected to the auxiliary second decoder DBr(0) and the adjacent second decoder DBr(1) via a node DECr(0), whereas the redundancy control circuit RLr(1) is connected to the auxiliary second decoder DBr(2) and the adjacent second decoder DBr(3) via the node DECr(1).

The auxiliary second decoders DBr(0) and DBr(1) are each constituted as a 2-input NAND gate with the input column address signal PY0 input to one of its input terminals and the other input terminal connected to the node DECr(0). In addition, the output terminal of the second decoder DBr(0) is connected to the column line driver DV11r(0) that drives the auxiliary column line CLr(0) and the output terminal of the second decoder DBr(1) is connected to the column line driver DV11r(1) that drives the auxiliary column line CLr(1). Likewise, the auxiliary second decoders DBr(2) and DBr(3) are each constituted as a 2-input NAND gate with the input column address signal PY0 input to one of its input terminals and the other input terminal connected to the node DECr(1). Furthermore, the output terminal of the second decoder DBr(2) is connected to the column line driver DV11r(2) that drives the auxiliary column line CLr(2) and the output terminal of the second decoder DBr(3) is connected to the column line driver DV11r(3) that drives the auxiliary column line CLr(3).

The pre-charge circuit PCa is connected to the fuse block FB(126) which corresponds to the column lines CL(252) and CL(253) via fuse nodes F0ca and F1ca and the pre-charge circuit PCb is connected to the fuse block FB(127) which corresponds to the column lines CL(254) and CL(255) via fuse nodes F0cb and F1cb. The pre-charge circuits PCa and PCb charge the fuses FU0(0)~FU0(127) and the fuses FU1(0)~FU1(127) to the level of the source voltage Vcc when input row address signals PX0 and PX1 are at the substrate voltage Vss.

The input row address signals PX0 and PX1 are input to the fuse driver FDV which is provided adjacent to the fuse block FB(0) corresponding to the column lines CL(0) and CL(1) and the fuse block FB(1) corresponding to the column lines CL(2) and CL(3). The output of the fuse driver FDV is connected to the fuse block FB(0) via fuse nodes F1(0) and F0(0), and is also connected to the fuse block FB(1) via fuse nodes Fl(1) and F0(1). The fuse driver FDV sets the fuses FU0(0)~FU0(127) to the substrate voltage Vss if the input row address signal PX0 is at the source voltage Vcc, and sets the fuses FU1(0)~FU1(127) to the substrate voltage Vss if the input row address signal PX1 is at the source voltage Vcc.

As explained above, in the column decoder circuit CD13 in the semiconductor memory in the third embodiment, one fuse block FB(2k) and one redundancy control circuit RL(2k) are assigned to two column lines CL(4k) and CL(4k+1) as in the column decoder circuit CD11 in the semiconductor memory in the first embodiment.

In the column decoder circuit CD13, the fuse blocks FB(0)~FB(127) and the redundancy control circuits RL(0)~RL(127) are divided into an even-numbered column group and an odd-numbered column group. The fuse blocks FB(0), FB0(2), ..., FB(2k), FB(2k+2), ..., FB(126) in the even-numbered column group and the fuse blocks FB(1), FB0(3), ..., FB(2k+1), FB(2k+3), ..., FB(127) in the odd-numbered column group are laid out over two stages in the direction in which the column lines CL extend. Likewise, the redundancy control circuits RL(0), RL(2), ..., RL(2k), RL(2k+2), ..., RL(126) in the even-numbered column group and the redundancy control circuits RL(1), RL(3), ..., RL(2k+1), RL(2k+3), ..., RL(127) in the odd-numbered column group are also laid out over two stages in the direction in which the column lines CL extend.

By adopting this unique structure, the space in the fuse blocks FB(0)~FB(127) along the direction in which the word lines WL extend is expanded to quadruple the size of the space available in the prior art. Thus, as in the semiconductor memories in the first and second embodiments, even if the pitch of the column lines CL(0)~CL(255) is reduced, the fuse blocks FB(0)~FB(127) are laid out with a pitch that is large enough to allow the internal fuses to be disconnected with accuracy. Since the fuse blocks FB(0)~FB(127) are laid out with enough space margin in this manner, failed fuse disconnection is minimized to achieve an improvement in product yield of the semiconductor memory.

Next, an operation achieved by the column decoder circuit CD13 in the semiconductor memory in the third embodiment to achieve a redundancy relief is explained.

By employing the column decoder circuit CD13 structured as described above, the column lines CL(4k) and CL(4k+1) controlled by the redundancy control circuit RL(2k) in the even-numbered column group are replaced by the column lines CL(4k+4) and CL(4k+5) which are controlled by the redundancy control circuit RL(2k+2) also belonging in the even-numbered column group, and the column lines CL(4k+2) and CL(4k+3) controlled by the redundancy control circuit RL(2k+1) in the odd-numbered column group are replaced by the column lines CL(4k+6) and CL(4k+7) which are controlled by the redundancy control circuit RL(2k+3) also belonging in the odd-numbered column group, for instance.

Now, the redundancy relief operation performed by the column decoder circuit CD13 is explained by using an example in which there is a failure at, at least, either the column line CL(4k) or the column line CL(4k+1) adjacent to the column line CL(4k).

First, in order to achieve a redundancy relief for a failure at the column line CL(4k) or column line CL(4k+1) in the semiconductor memory in the third embodiment, the fuse FU0(2k) provided in the fuse block FB(2k) is disconnected. This cuts off the fuse node F0(2k+2) from the fuse driver FDV, and sets the level at the fuse node F0(2k+2) to the source voltage Vcc. As a result, the output terminal of the first decoder DA(2k) and the node DECb(2k+2) of the redundancy control circuit RL(2k+2) become electrically continuous.

As the first decoder DA(2k) is selected by the input column address signals PY75, PY43 and PY21, the output signal YD(2k+2) output by the first decoder DA(2k) sets the voltage level at the node DECb(2k+2) of the redundancy control circuit RL(2k+2) to the substrate voltage Vss. In addition, the node DEC(2k+2) which is the output node of the redundancy control circuit RL(2k+2) is set to the source voltage Vcc by the inverter DINV(2k+2).

As illustrated in FIG. 5, the node DEC(2k+2) is connected to the second decoder DB(4k+4) and the second decoder DB(4k+5). When the second decoders DB(4k+4) and DB(4k+5) are selected by the input column address signal PY0, the column line drivers DV11(4k+4) and DV11(4k+5) enter an active state to drive the column lines CL(4k+4) and CL(4k+5) to the level equal to the source voltage Vcc.

Thus, the column lines CL(4k) and CL(4k+1) with a failure are replaced by the column lines CL(4k+4) and CL(4k+5) which are four addresses ahead.

As explained above, in the semiconductor memory in the third embodiment, the column lines CL(4k) and the adjacent column line CL(4k+1) are together replaced by the column lines CL(4k+4) and CL(4k+5) respectively, and the column lines CL(4k+2) and the adjacent column line CL(4k+3) are together replaced by the column lines CL(4k+6) and CL(4k+7) respectively, for instance. In other words, since up to four adjacent column lines CL can be replaced by other column lines in the semiconductor memory in the third embodiment, a redundancy relief for failures occurring at the column lines CL in various patterns can be achieved with a higher degree of flexibility.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the explanation is given above in reference to the embodiments on an example in which there are 256 column lines CL, the number of column lines CL is not limited to this example.

As explained, in the semiconductor memory according to the present invention, a redundancy relief is achieved even when failures occur at the same time in adjacent column lines. In addition, the fuses provided in the fuse blocks can be disconnected with greater ease to achieve redundancy relief of column line failures in a stable manner while achieving a larger capacity and higher integration.

The entire disclosure of Japanese Patent Application No. 11-211335 filed on Jul 26, 1999 including specification, claims, drawings and summary is incorporated herein by reference in its entirety.

What is claimed is:

1. A semiconductor memory provided with a column line decoder circuit comprising:

n decoders (n is an integer equal to or larger than 1) that each output a SELECTED signal;

n fuse blocks, each provided with a fuse that is disconnected in correspondence to a column line state; and a redundancy control circuit group constituted of n+m (m is an integer equal to or larger than 1) redundancy control circuits, wherein a (k+m)th redundancy control circuit (k is an integer equal to or larger than 1 and equal to or smaller than n) selects either the SELECTED signal output by a kth decoder or the SELECTED signal output by a (k+m)th decoder for a respective column line of the semiconductor memory, by employing the n fuse blocks, the n fuse blocks being implemented as fuse blocks in an even-numbered column group and fuse blocks in an odd-numbered column group, wherein respective pairs of an even-numbered column group fuse block and an odd-numbered column group fuse block are implemented in two stages along a column line direction.

2. A semiconductor memory according to claim 1, wherein the column lines are configured into n+m column line groups each including two or more of the column lines, the semiconductor memory further comprising:

n+m second decoder units that provide the SELECTED signals from respective redundancy control circuits to the column line groups.

3. A semiconductor memory according to claim 2, wherein:

said second decoder units each include two or more second decoders corresponding to two or more of the column lines.

4. A semiconductor memory according to claim 3, wherein:

said second decoders are each constituted of a NAND gate.

5. A semiconductor memory according to claim 1, wherein:

said decoders are each constituted of a NAND gate.

6. A semiconductor memory according to claim 1, wherein:

said (k+m)th redundancy control circuit is provided with;
a first transfer gate through which said SELECTED signal output by said kth decoder passes, and
a second transfer gate through which said SELECTED signal output by said (k+m)th decoder passes.

7. A semiconductor memory provided with a column line decoder circuit comprising:

n decoders (n is an integer equal to a larger than 1) that each output a SELECTED signal;

n fuse blocks, each provided with a fuse that is disconnected in correspondence to a column line state; and a redundancy control circuit group constituted of n+m (m is an integer equal to or larger than 1) redundancy control circuits, with a (k+m)th redundancy control circuit (k is an integer equal to or larger than 1 and equal to or smaller than n) selecting either said SELECTED signal output by a kth decoder among said n decoders or said SELECTED signal output by a (k+m)th decoder by employing said n fuse blocks, to provide said SELECTED signals thus selected to n+m column lines of the semiconductor memory, said n fuse blocks being implemented as fuse blocks in an even-numbered column group and fuse blocks in an odd-numbered column group, wherein respective pairs of an even-numbered column group fuse block and an odd-numbered column group fuse block are implemented in two stages along a column line direction.

8. A semiconductor memory according to claim 2, wherein:

said two or more column lines constituting each of said column line groups are provided successively along a direction in which word lines of the semiconductor memory extend.

9. A semiconductor memory according to claim 7, wherein:

said decoders are each constituted of a NAND gate.

10. A semiconductor memory according to claim 7, wherein:

said (k+m)th redundancy control circuit is provided with;
a first transfer gate through which said SELECTED signal output by said kth decoder passes; and
a second transfer gate through which said SELECTED signal output by said (k+m)th decoder passes.

11. A semiconductor memory provided with a column line decoder circuit comprising:

n first decoders (n is an integer equal to or larger than 1) that each output a SELECTED signal;

n fuse blocks, each provided with a fuse that is disconnected in correspondence to a column line state;

a redundancy control circuit group constituted of n+m (m is an integer equal to or larger than 1) redundancy control circuits, with a (k+m)th redundancy control circuit (k is an integer equal to or larger than 1 and equal to or smaller than n) selecting either said SELECTED signal output by a kth first decoder or said SELECTED signal output by a (k+m)th first decoder among said n first decoders by employing said n fuse blocks; and n+m second decoder units that provide said SELECTED signals selected by individual redundancy control circuits to n+m column line groups of the semiconductor memory each constituted of two or more column lines, said n fuse blocks being implemented as fuse blocks in an even-numbered column group and fuse blocks in an odd-numbered column group, wherein respective pairs of an even-numbered column group fuse block and an odd-numbered column group fuse block are implemented in two stages along a column line direction.

12. A semiconductor memory according to claim 11, wherein:

a second decoder units each include two or more second decoders corresponding to two or more of the column lines.

13. A semiconductor memory according to claim 12, wherein:

said second decoders are each constituted of a NAND gate.

14. A semiconductor memory according to claim 11, wherein:

said two or more column lines constituting each of said column line groups are provided successively along a direction in which word lines of the semiconductor memory extend.

15. A semiconductor memory according to claim 11, wherein:

said first decoders are each constituted of a NAND gate.

16. A semiconductor memory according to claim 11, wherein:

said (k+m)th redundancy control circuit is provided with;
 a first transfer gate through which said SELECTED signal output by said kth first decoder passes and
 a second transfer gate through which said SELECTED signal output by said (k+m)th first decoder passes.

* * * * *